(12) United States Patent
Daanen et al.

(10) Patent No.: US 6,191,659 B1
(45) Date of Patent: Feb. 20, 2001

(54) INTEGRATED OSCILLATOR WITH REDUCED JITTER

(75) Inventors: Antonius M. J. Daanen, Zürich; Martin Kucera, Baeretswil, both of (CH)

(73) Assignee: U.S. Philips Corporation, New York, NY (US)

(*) Notice: Under 35 U.S.C. 154(b), the term of this patent shall be extended for 0 days.

(21) Appl. No.: 09/179,286

(22) Filed: Oct. 27, 1998

(30) Foreign Application Priority Data

Oct. 30, 1997 (EP) .................................................. 97203364

(51) Int. Cl.[7] ....................................................... H03B 5/00
(52) U.S. Cl. ...................... 331/74; 331/158; 331/116 R; 331/108 D; 327/205
(58) Field of Search .................................. 331/74, 108 D, 331/158, 116 R, 108 C; 327/205

(56) References Cited

U.S. PATENT DOCUMENTS 5,455,542 * 10/1995 Spence et al. ........................ 331/158
5,739,728    4/1998 Kim ...................................... 331/111

FOREIGN PATENT DOCUMENTS

0486207A1    5/1992 (EP).

* cited by examiner

Primary Examiner—Arnold Kinkead
(74) Attorney, Agent, or Firm—Brian J. Wieghaus

(57) ABSTRACT

An oscillator in an integrated circuit in which the oscillator signal is taken from the output of a comparator, and the decision level of the comparator is determined by the voltage difference between the input of the comparator and the substrate of the integrated circuit. Interference voltages on the substrate, caused by other circuitry on the integrated circuit, are compensated with equal interference voltages at the input of the comparator. To effect this compensation, a capacitor is connected between the input of the comparator and the substrate, in lieu of the conventional capacitor that is connected between the input of the comparator and a ground potential.

2 Claims, 1 Drawing Sheet

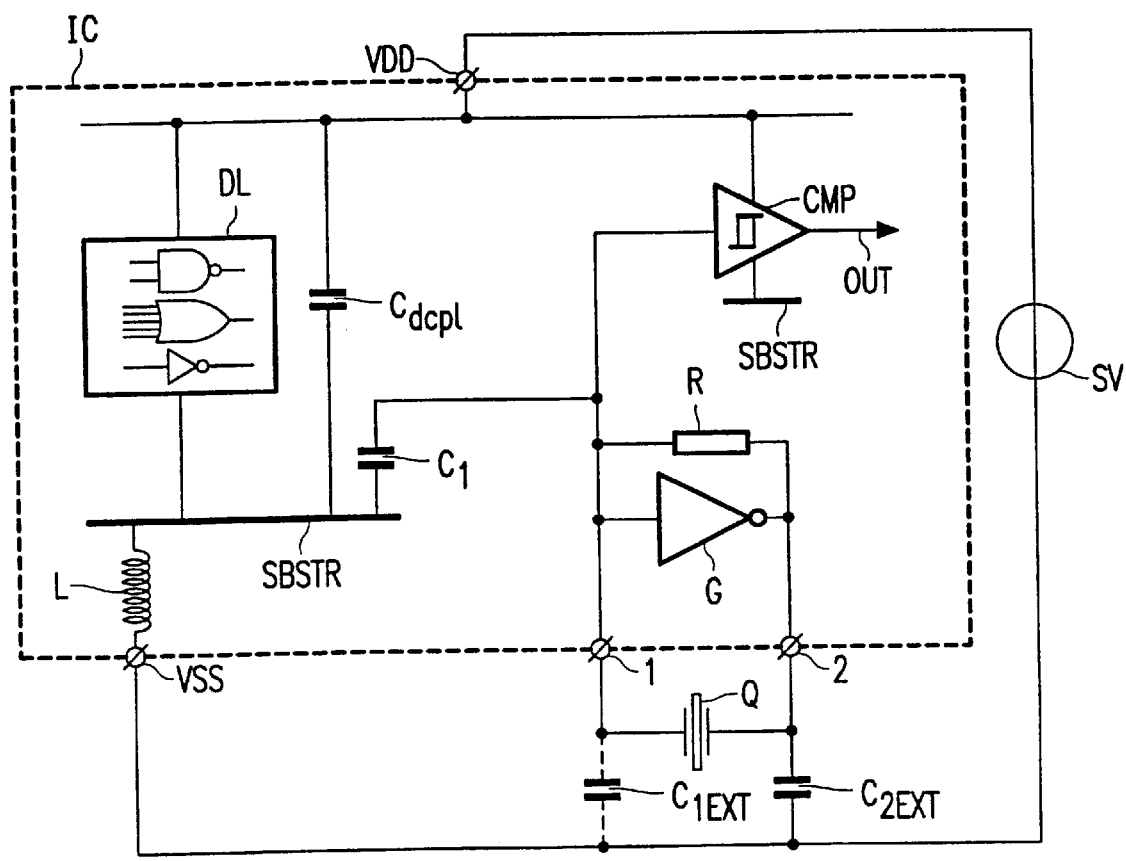

INTEGRATED OSCILLATOR WITH REDUCED JITTER

BACKGROUND OF THE INVENTION

The invention relates to an oscillator in an integrated circuit, which integrated circuit comprises: a first supply pin and a second supply pin for receiving a supply voltage; a first signal pin; a second signal pin; an amplifier having an input coupled to the first signal pin and having an output coupled to the second signal pin; a comparator having a first supply terminal coupled to the first supply pin, having a second supply terminal coupled to the substrate, having an input coupled to the first signal pin, and having an output for supplying an output signal; and a phase-shifting element.

Such an oscillator is known from the general state of the art. In such an oscillator the phase-shifting element, which together with other electronic components in the oscillator provides the generally known phase condition of oscillators having an external capacitor coupled between the first signal pin and the second power supply pin. In addition to the oscillator the integrated circuit also includes digital circuits. During change-over from a logic low level to a logic high level or vice versa these digital circuits produce a spurious voltage on the substrate. It is common practice to couple the second supply terminal of the comparator to the substrate by means of substrate contacts in order to preclude latch-up problems. The spurious voltage affects the decision level of the comparator. An adverse effect of this is that the oscillator signal is afflicted with jitter.

SUMMARY OF THE INVENTION

It is an object of the invention to provide an oscillator which exhibits less jitter.

To this end, according to the invention, the oscillator of the type defined in the opening paragraph is characterized in that the phase-shifting element comprises an integrated capacitor having a first electrode coupled to the input of the comparator and having a second electrode coupled to the substrate. Thus, it is achieved that the spurious voltage appears both on the input of the comparator and on the second supply terminal of the comparator. The decision level of the comparator is then no longer affected by the spurious voltage, so that the jitter of the oscillator is reduced considerably.

The oscillator is further characterized in that the comparator comprises a Schmitt trigger. As a result of the hysteresis in the Schmitt trigger the jitter is reduced even further.

BRIEF DESCRIPTION OF THE DRAWINGS

The invention will be described in more detail with reference to the accompanying drawing, in which the FIGURE shows an electrical circuit diagram of an oscillator embodying the invention.

DESCRIPTION OF THE PREFERRED EMBODIMENTS

In the FIGURE the components of the integrated circuit IC by means of which an embodiment of an oscillator in accordance with the invention is implemented are shown within a broken-line frame. The external components required for the oscillator are shown outside the broken-line frame.

The integrated circuit IC comprises a first supply pin VDD and a second supply pin VSS which are connected to a supply voltage source SV to receive a supply voltage. The integrated circuit IC further comprises a first signal pin 1 and a second signal pin 2. An amplifier G, which by way of example is implemented by means of an inverter, has an input connected to the first signal pin 1 and has an output connected to the second signal pin 2. A resistive element R is arranged between the input and the output of the amplifier G. A comparator CMP, which is preferably implemented by means of a Schmitt trigger, has a first and a second supply terminal connected to the first supply pin VDD and the substrate SBSTR of the integrated circuit IC. The comparator CMP has its input coupled to the first signal pin 1. The comparator CMP further has an output OUT for supplying an oscillator signal. The phase-shifting network required for the oscillator comprises an integrated capacitor $C_1$ connected between the input of the comparator CMP and the substrate SBSTR, an external capacitor $C_{2EXT}$ arranged between the second signal pin 2 and the second supply pin VSS, and a resonator Q, which is generally realized by means of a quartz crystal.

The integrated circuit IC further includes digital circuits DL which are also connected to the first supply pin VDD and the second supply pin VSS to receive the supply voltage. During the change-over from a logic low level to a logic high level, or voce versa, the digital circuits DL produce a spurious voltage on the substrate SBSTR. A decoupling capacitor $C_{dcp1}$ is coupled between the first supply pin VDD and the substrate SBSTR in order to minimize the spurious voltage.

The FIGURE further shows a parasitic coil L arranged in series with the substrate SBSTR and the second supply pin VSS. The parasitic coil L represents a bonding wire between the substrate SBSTR and a bond pad belonging to the second supply pin VSS. The parasitic coil L forms a major cause for the appearance of the spurious voltage on the substrate SBSTR. This is caused by the fact that a voltage is induced across the parasitic coil L as a result of the change in the current consumption of the digital circuits DL during the change-over from a logic high level to a logic low level, or vice versa.

The oscillator operates as follows. Together with the phase-shifting network the amplifier G forms a closed loop. A first oscillation condition is that the loop gain is higher than unity. Since the crystal can have a comparatively high equivalent resistance the required gain to be produced by the amplifier G must be comparatively high. However, during starting of the oscillator the equivalent resistance of the crystal can be so high that the feedback path is not efficient enough. This would prohibit starting of the oscillator. In order to remedy this, the resistive element R is arranged in parallel with the crystal. This resistive element R can be implemented, for example, by means of a resistor or by means of a diode. A second oscillation condition is that the total phase shift in the closed loop is zero degrees (or a multiple of 360 degrees). For this purpose, the integrated capacitor $C_1$ and the external capacitor $C_{2EXT}$ have been provided. The frequency of the oscillator is determined by means of the quartz crystal.

The essence of the invention resides in the integrated capacitor $C_1$. This integrated capacitor $C_1$ takes the place of an external capacitor $C_{1EXT}$ used in the general state of the art and shown in broken lines in the FIGURE. In an oscillator in accordance with the general state of the art the voltage on the first signal pin 1 will be substantially equal to the voltage on the second supply pin VSS for high frequencies. This is because the external capacitor $C_{1EXT}$ forms substantially a short-circuit for high frequencies. Since the input of the comparator CMP is interconnected to the first signal pin 1 the voltage on the input of the comparator CMP will be substantially equal to the voltage on the second supply pin VSS and will consequently not be afflicted with the spurious voltage. This is because the spurious voltage is present on the substrate SBSTR and not on the second supply pin VSS. Thus, in the general state of the art the situation is that the input of the comparator CMP does not carry the spurious voltage whereas the second supply terminal of the comparator CMP does carry the spurious voltage. Since the decision level of the comparator CMP is determined by the voltage difference between the input of the comparator CMP and the second supply terminal of the comparator CMP, the spurious voltage on the substrate SBSTR results in an undesired jitter in the oscillator signal.

In an oscillator in accordance with the invention the integrated capacitor $C_1$ forms substantially a short-circuit for high frequencies, as a result of which the same spurious voltage appears on the input of the comparator CMP as on the second supply terminal of the comparator CMP. The voltage difference between the input of the comparator CMP and the second supply terminal of the comparator CMP is therefore substantially zero, which has the favorable result that the jitter in the oscillator signal is reduced drastically.

It is important that a possible external parasitic capacitance between the first signal pin 1 and the second supply terminal VSS is minimal because otherwise the spurious voltage on the input of the comparator CMP is smaller than the spurious voltage on the second terminal of the comparator CMP as a result of a capacitive voltage division. This would result in the jitter reduction being smaller.

Furthermore, it is to be noted that the external capacitor $C_{2EXT}$ can also be replaced by an integrated capacitor, which should then be connected between the output of the amplifier G and the substrate SBSTR.

What is claimed is:

1. An oscillator in an integrated circuit which integrated circuit comprises: a substrate; first supply pin and a second supply pin for receiving a supply voltage; a first signal pin; a second signal pin; an amplifier having an input coupled to the first signal pin and having an output coupled to the second signal pin; a comparator having a first supply terminal coupled to the first supply pin, having a second supply terminal coupled to the substrate, having an input coupled to the first signal pin, and having an output for supplying an output signal; and a phase-shifting element, characterized in that the phase-shifting element comprises an integrated capacitor having a first electrode coupled to the input of the comparator and having a second electrode coupled to the substrate.

2. An oscillator as claimed in claim 1, characterized in that the comparator comprises a Schmitt trigger.

* * * * *